(12) United States Patent
Mohanta et al.

(10) Patent No.: US 11,988,421 B2
(45) Date of Patent: May 21, 2024

(54) HEAT EXCHANGER FOR POWER ELECTRONICS

(71) Applicant: Carrier Corporation, Palm Beach Gardens, FL (US)

(72) Inventors: Lokanath Mohanta, Syracuse, NY (US); Arindom Joardar, Syracuse, NY (US); Konstantin Borisov, Bloomfield, CT (US); Ismail Agirman, Bloomfield, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 64 days.

(21) Appl. No.: 17/744,074

(22) Filed: May 13, 2022

(65) Prior Publication Data
US 2022/0373236 A1 Nov. 24, 2022

Related U.S. Application Data

(60) Provisional application No. 63/201,968, filed on May 20, 2021.

(51) Int. Cl.
F25B 39/00 (2006.01)
F25B 5/02 (2006.01)
(Continued)

(52) U.S. Cl.
CPC ............. *F25B 39/00* (2013.01); *F25B 5/02* (2013.01); *H05K 7/20263* (2013.01);
(Continued)

(58) Field of Classification Search
CPC .......... F25B 39/00; F25B 39/024; F25B 5/02; F25B 2400/0411; H05K 7/20263;
(Continued)

(56) References Cited

U.S. PATENT DOCUMENTS 6,116,040 A 9/2000 Stark
6,497,554 B2 12/2002 Yang
(Continued)

FOREIGN PATENT DOCUMENTS

CN 203353466 U 12/2013
CN 205718109 U 11/2016
(Continued)

OTHER PUBLICATIONS

US 8,826,682, 9/2013, Mcsweeney (withdrawn)

*Primary Examiner* — Henry T Crenshaw
*Assistant Examiner* — Kamran Tavakoldavani
(74) *Attorney, Agent, or Firm* — CANTOR COLBURN LLP

(57) ABSTRACT

A heat exchanger comprising a pair of metal plates joined along corresponding mating surfaces, wherein at least one of the metal plates comprises a plurality of connected recesses which form a fluid circuit between the plates when the plates are joined, wherein the fluid circuit comprises an inlet, an inlet manifold, an outlet, an outlet manifold, and a plurality of flowpaths extending between and fluidly connecting the inlet manifold and outlet manifold, and wherein one or more of the plurality of flowpaths comprise a fluid passage and a flow constriction and wherein a ratio of the hydraulic diameter of the flow constriction to the hydraulic diameter of the fluid passage increases with increasing distance from the inlet.

19 Claims, 7 Drawing Sheets

(51) Int. Cl.
*F25B 39/02* (2006.01)
*H05K 7/20* (2006.01)

(52) U.S. Cl.
CPC ..... *H05K 7/20272* (2013.01); *H05K 7/20927* (2013.01); *F25B 39/024* (2013.01); *F25B 2400/0411* (2013.01)

(58) Field of Classification Search
CPC ............ H05K 7/20272; H05K 7/20927; F28F 9/0263; F28F 9/0282
See application file for complete search history.

(56) References Cited

U.S. PATENT DOCUMENTS

| | | | |
|---|---|---|---|
| 6,560,984 | B2 | 5/2003 | Bellet |
| 6,688,124 | B1 | 2/2004 | Stark et al. |
| 6,708,521 | B2 | 3/2004 | Wurth |
| 6,832,488 | B2 | 12/2004 | Yokozeki et al. |
| 7,003,971 | B2 | 2/2006 | Kester et al. |
| 7,164,242 | B2 | 1/2007 | Borrego |
| 7,412,842 | B2 | 8/2008 | Pham |
| 8,209,057 | B2 | 6/2012 | Judge et al. |
| 8,234,881 | B2 | 8/2012 | Yanik et al. |
| 8,539,786 | B2 | 9/2013 | Mcsweeney |
| 8,933,557 | B2 | 1/2015 | Gohara et al. |
| 8,944,777 | B2 | 2/2015 | Sakanobe et al. |
| 8,950,201 | B2 | 2/2015 | Voorhis |
| 9,119,326 | B2 | 8/2015 | Mcdonnell et al. |
| 9,402,336 | B2 | 7/2016 | Suzuki et al. |
| 9,476,626 | B2 | 10/2016 | Penn, II et al. |
| 9,528,718 | B2 | 12/2016 | De |
| 9,819,159 | B2 | 11/2017 | Smith et al. |
| 10,024,321 | B2 | 7/2018 | Pham et al. |
| 10,184,701 | B2 | 1/2019 | Sun et al. |
| 10,197,052 | B2 | 2/2019 | Felix |
| 10,295,239 | B2 | 5/2019 | West et al. |
| 10,314,200 | B2 | 6/2019 | Sykora et al. |
| 10,390,466 | B2 | 8/2019 | Held et al. |
| 10,424,570 | B2 | 9/2019 | Kimura et al. |
| 10,508,841 | B2 | 12/2019 | Roth |
| 10,627,146 | B2 | 4/2020 | Wallis et al. |
| 2010/0147492 | A1 | 6/2010 | Conry |
| 2016/0123637 | A1* | 5/2016 | Moreno ................ F25B 39/02 62/516 |
| 2016/0305429 | A1* | 10/2016 | Zhou ..................... F04C 23/001 |
| 2018/0347911 | A1* | 12/2018 | Motegi ..................... F28D 1/06 |
| 2019/0277560 | A1* | 9/2019 | Roekens ............... F25B 27/007 |
| 2020/0224948 | A1 | 7/2020 | Kim et al. |
| 2021/0268868 | A1* | 9/2021 | Schroeder ............... F25B 41/20 |
| 2021/0341189 | A1* | 11/2021 | Peppard ................ F28D 1/0443 |
| 2022/0042745 | A1* | 2/2022 | Hirokawa ............ B23K 1/0012 |

FOREIGN PATENT DOCUMENTS

| | | |
|---|---|---|
| CN | 109539463 A | 3/2019 |
| CN | 209642583 U | 11/2019 |
| CN | 111355428 A | 6/2020 |
| CN | 111448752 A | 7/2020 |
| CN | 211084516 U | 7/2020 |
| EP | 1818629 A2 | 8/2007 |
| EP | 3163220 A1 | 5/2017 |
| EP | 3598026 A1 | 1/2020 |

\* cited by examiner

HEAT EXCHANGER FOR POWER ELECTRONICS

CROSS-REFERENCE TO RELATED APPLICATIONS

This application claims the benefit of U.S. Provisional Application No. 63/201,968 filed May 20, 2021, the disclosure of which is incorporated herein by reference in its entirety.

BACKGROUND

Exemplary embodiments pertain to the art of heat exchangers. More particularly, the present disclosure relates to configurations of heat exchangers for cooling power electronics.

Power electronic devices such as motor drives can generate waste heat during operation based on the efficiency of the device. Additionally, when the power electronic devices heat up their efficiency can degrade adding to the amount of heat they generate. When configured into a refrigeration system, effective thermal integration of these devices can be important aspect to the system's overall efficiency and reliability. Consequently, a goal of the system integrator is to maintain these components within a range of operating temperatures which will maximize the system efficiency. Accordingly, there remains a need in the art for heat exchangers configured to closely integrate with power electronic devices which can maintain optimal temperatures for these components under a variety of load conditions.

BRIEF DESCRIPTION

Disclosed is a heat exchanger comprising a pair of metal plates joined along corresponding mating surfaces, wherein at least one of the metal plates comprises a plurality of connected recesses which form a fluid circuit between the plates when the plates are joined, wherein the fluid circuit comprises an inlet, an inlet manifold, an outlet, an outlet manifold, and a plurality of flowpaths extending between and fluidly connecting the inlet manifold and outlet manifold, wherein one or more of the plurality of flowpaths comprise a fluid passage and a flow constriction, and wherein a ratio of the hydraulic diameter of the flow constriction to the hydraulic diameter of the fluid passage increases with increasing distance from the inlet.

In addition to one or more of the features described herein, or as an alternative, further embodiments, wherein the heat exchanger is configured for operation in a substantially vertical orientation, wherein a major axis of the inlet manifold and a major axis of the outlet manifold extend substantially vertically, and the plurality of fluid passages are arranged one atop of the other, and wherein the inlet is disposed below the outlet such that during operation a flow direction of a refrigerant through the inlet and outlet manifolds opposes gravity.

In addition to one or more of the features described herein, or as an alternative, further embodiments, wherein a first flow constriction is disposed in the fluid passage closest to the inlet and comprises a ratio of hydraulic diameter of the flow constriction to the hydraulic diameter of the fluid passage of between 0.3 and 0.5 inclusive or end points.

In addition to one or more of the features described herein, or as an alternative, further embodiments, wherein the flow constrictions are disposed between the fluid passages and the inlet manifold.

In addition to one or more of the features described herein, or as an alternative, further embodiments, wherein both plates comprise correspondingly arranged connected recess that when joined form the fluid circuit.

In addition to one or more of the features described herein, or as an alternative, further embodiments, wherein a first group of two or more adjacent flowpaths closest to the inlet comprise a flow constriction having a first flow constriction hydraulic diameter and a second group of two or more adjacent flowpaths, not in the first group, comprise a flow constriction having a second flow constriction hydraulic diameter, and wherein the second flow constriction hydraulic diameter is greater than the first flow constriction hydraulic diameter.

In addition to one or more of the features described herein, or as an alternative, further embodiments, wherein the second flow constriction hydraulic diameter is equal to from 1.2 to 1.5 times the first flow constriction hydraulic diameter.

In addition to one or more of the features described herein, or as an alternative, further embodiments, further comprising a third group of two or more adjacent flowpaths, not in the first group or second group, comprising a flow constriction having a third flow constriction hydraulic diameter, and wherein the third flow constriction hydraulic diameter is greater than each the first flow constriction hydraulic diameter and the second flow constriction hydraulic diameter.

In addition to one or more of the features described herein, or as an alternative, further embodiments, wherein the third flow constriction hydraulic diameter is equal to from 1.2 to 1.5 times the second flow constriction hydraulic diameter.

In addition to one or more of the features described herein, or as an alternative, further embodiments, wherein the second flow constriction hydraulic diameter is equal to from 1.2 to 1.5 times the first flow constriction hydraulic diameter and the third flow constriction hydraulic diameter is equal to between 1.2 and 1.5 times the second flow constriction hydraulic diameter.

In addition to one or more of the features described herein, or as an alternative, further embodiments, comprising greater than two groups of adjacent flowpaths through the heat exchanger, each flowpath comprising a fluid passage and a flow constriction, wherein the flow constrictions in flowpaths of groups further distanced from the inlet comprises a flow constriction hydraulic diameter equal to from 1.2 to 1.5 times the flow constriction hydraulic diameter of the flow constrictions in the flowpaths of groups immediately adjacent and closer to the inlet.

In addition to one or more of the features described herein, or as an alternative, further embodiments, wherein during operation, the refrigerant entering the inlet is a single phase liquid refrigerant having a vapor quality equal to zero, and the refrigerant exiting the outlet is a two-phase mixture having a vapor quality between 0.4 and 0.6, inclusive of end points.

In addition to one or more of the features described herein, or as an alternative, further embodiments, further comprising a power electronics module mounting feature disposed on a face of one of the metal plates, and wherein the face is disposed on a side of the metal plate opposite the mating surface.

In addition to one or more of the features described herein, or as an alternative, further embodiments, wherein the connected recesses forming the inlet and outlet each comprise an engagement feature for securing a fluid conduit thereto.

In addition to one or more of the features described herein, or as an alternative, further embodiments, wherein the plates are joined by a weld and wherein the weld forms a seal between the plates along at least a portion of the mating surfaces.

In addition to one or more of the features described herein, or as an alternative, further embodiments, wherein the plates are joined by a compression mechanism configured to hold the plates together.

In addition to one or more of the features described herein, or as an alternative, further embodiments, further comprising a seal material disposed between the plates for preventing leakage from the fluid circuit.

In addition to one or more of the features described herein, or as an alternative, further embodiments, wherein the fluid passage extends at a tilt angle of less than or equal to 10°.

In addition to one or more of the features described herein, or as an alternative, further embodiments a refrigerant cycle machine comprising a primary refrigeration circuit configured for passing a refrigerant through a compressor, a heat rejecting heat exchanger, an expansion valve, and a heat absorbing heat exchanger in a serial flow arrangement, an expansion valve bypass circuit for diverting at least a portion of the refrigerant exiting the condenser of the primary refrigeration circuit to an electronics cooler and returning the portion of the refrigerant to the evaporator, and wherein the electronics cooler comprises the heat exchanger as described herein and wherein the portion of the refrigerant is directed through the heat exchanger to cool one or more power electronics modules attached in thermal communication thereto.

In addition to one or more of the features described herein, or as an alternative, further embodiments, wherein the expansion valve bypass circuit comprises two electronics coolers disposed in parallel flow arrangement, one for cooling a power rectifier and the other for cooling an inverter.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
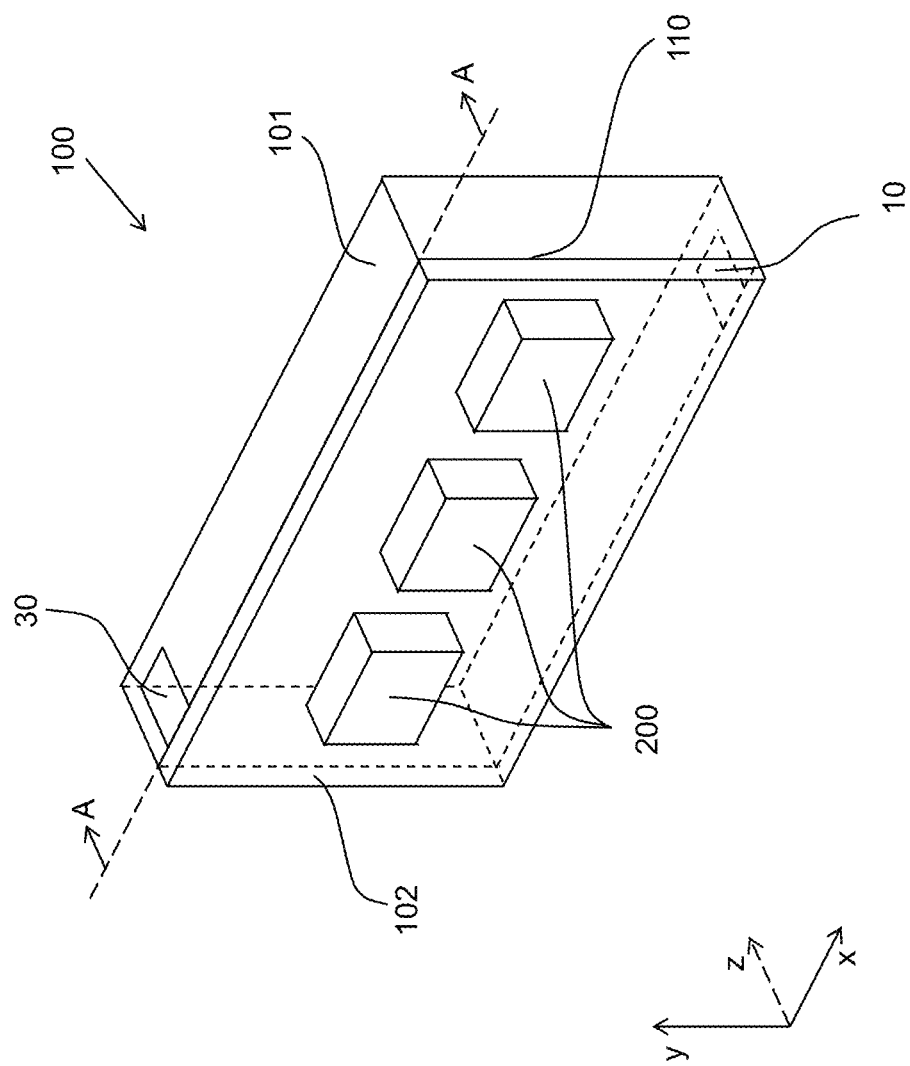
FIG. 1 is a schematic illustration of a heat exchanger having and power electronic modules mounted thereto in an example embodiment.
Figure 2:
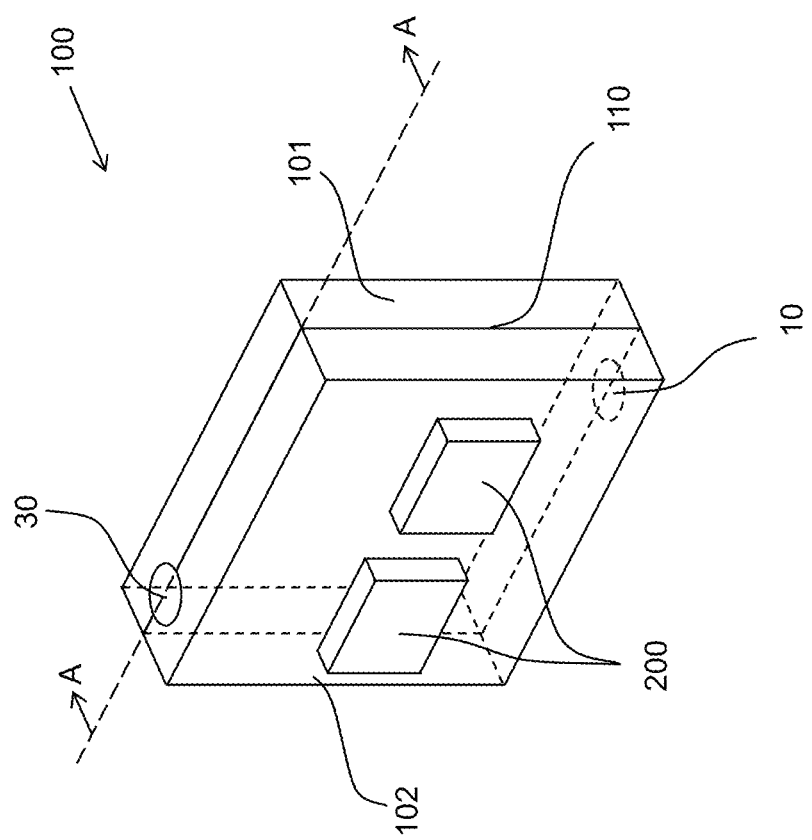
FIG. 2 is a schematic illustration of a heat exchanger having and power electronic modules mounted thereto in an example embodiment.
Figure 3:
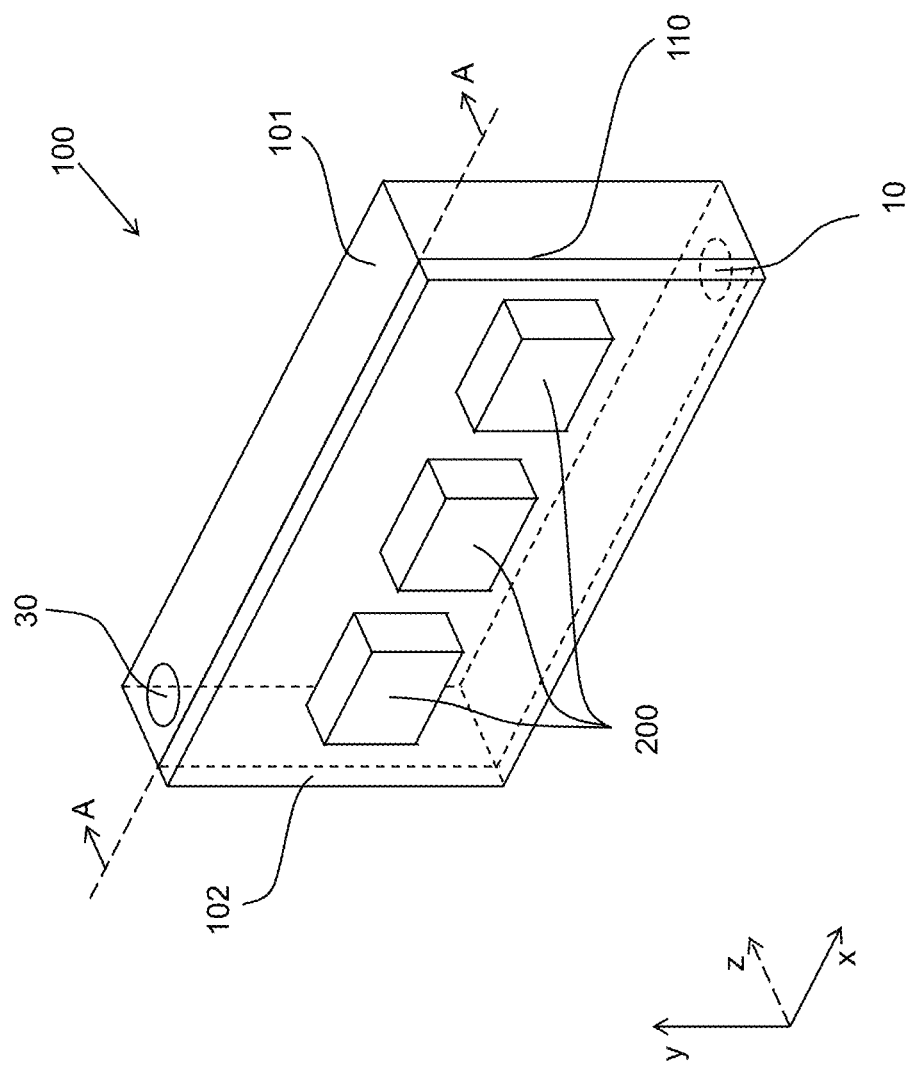
FIG. 3 is a schematic illustration of a heat exchanger having and power electronic modules mounted thereto in an example embodiment.

FIGS. 1-3 include schematic illustrations of a heat exchanger 100 formed from a pair of metal plates (101, 102). The plates (101, 102) are joined along corresponding mating surfaces and form a seam 110 therebetween. The heat exchanger 100 includes a fluid inlet 10 and fluid outlet 30. The metal plates (101, 102) can be formed of any metal, e.g., aluminum, aluminum alloy, steel, steel alloy, copper, copper alloy, or the like. The metal plates (101, 102) can abut one another along a side and can be joined using any suitable means such as brazing, welding, clamping, compressing, bolting, and the like. The mating surfaces of the metal plates (101, 102) can be configured to correspond to one another, e.g., to fit together and seal the fluid circuit therebetween. The mating surfaces of the metal plates (101, 102) can include precision surfaces formed from a process having highly accurate and precise dimensional control, such as through computer numerical control (CNC) machining process and/or net shape, or near net shape manufacturing process. Optionally a sealing material can be disposed between the metal plates (101, 102) to aide in preventing leakage from the fluid circuit.

As illustrated in the heat exchanger 100 of FIG. 1, the metal plates (101, 102) can have different thicknesses (e.g., in the z-dimension of the attached figures). A first metal plate 101 can be thicker than a second metal plate 102. In such an embodiment, the first metal plate 101 can include a plurality of connected recesses 105, discussed further below, formed into its thickness dimension. These recesses 105 in the first plate 101 can substantially form three surfaces of the fluid passages formed between the plates and the second metal plate 102 can substantially form the fourth surface of the fluid passages. For example, recesses in the first plate 101 can substantially form about 60% to about 90% of the wetted perimeter of the fluid passage formed between the plates, or about 65% to about 80%, or about 70% to about 75%, or about 75%.

A further example of the heat exchanger 100 can be found in FIG. 2 which illustrates how the metal plates (101, 102) can have substantially equal thicknesses (e.g., in the z-dimension of the attached figures). The thickness of the first metal plate 101 can be substantially the same (e.g., such as allowing for industrially acceptable manufacturing tolerances) as the thickness of the second metal plate 102. For example, both the first metal plate 101 and the second metal plate 102 can each include a plurality of connected recesses 105 formed into their thickness dimensions (e.g., in the z-dimension of the attached figures). The arrangement of the connected recesses 105 on the two metal plates (101, 102)

can mirror one another such that when joined the recesses form approximately equal portions of the wetted perimeter of the fluid passages formed therebetween.

The inventors further contemplate structures that have non-equal depth of recesses between the two metal plates (101, 102) such that one plate has a fractional depth of 1% to 49% of the total depth of the fluid passages formed between the plates and the other plate has the corresponding fractional depth from 99% to 51%.

The fluid inlet 10 and the fluid outlet 30 of heat exchanger 100 can be any shape, such as in the depth dimension of the plate (e.g., in the z-x plane of the attached figure), including the shape of a circle, oval, triangular, square, rectangular, or any simple polygonal shape or portion thereof. The perimeter of the fluid inlet 10, fluid outlet 30, or both, can be formed from a recess (e.g., of the plurality of connected recesses 105), in one or both metal plates (101, 102), which extends to an edge of the plate(s), as illustrated in FIGS. 1-2. Alternatively, the fluid inlet 10, fluid outlet 30, or both can be disposed in one of the two metal plates (101, 102) as shown in FIG. 3. The fluid inlet 10 can be configured to connect a first heat transfer fluid (e.g., refrigerant) source (e.g., condenser of a vapor compression system) to the inlet manifold 12 using any suitable mechanical connection (e.g., compression coupling, brazing, welding, and the like). The fluid outlet 30 can be configured to connect a first heat transfer fluid sink (e.g., evaporator of a vapor compression system) to the outlet manifold 28 using any suitable mechanical connection (e.g., compression coupling, brazing, welding, and the like).

As illustrated in FIG. 3, the perimeter of the fluid inlet 10, the fluid outlet 30, or the perimeters of each can be formed entirely within one of the metal plates (101, 102), such as in a casting, machining, drilling, or similar process where the corresponding other metal plate does not form any of said perimeter. For example, one of the metal plates (101, 102) can entirely form the perimeter of one of the fluid inlet 10 or the fluid outlet 30, and the corresponding other plate can form the other. Still further, the metal plates (101, 102) can entirely form the perimeter of one of the fluid inlet 10 or the fluid outlet 30 and partially forms the perimeter of the other (e.g., cooperating with the other plate to form the perimeter of the other fluid inlet 10 or fluid outlet 30).

Figure 4:
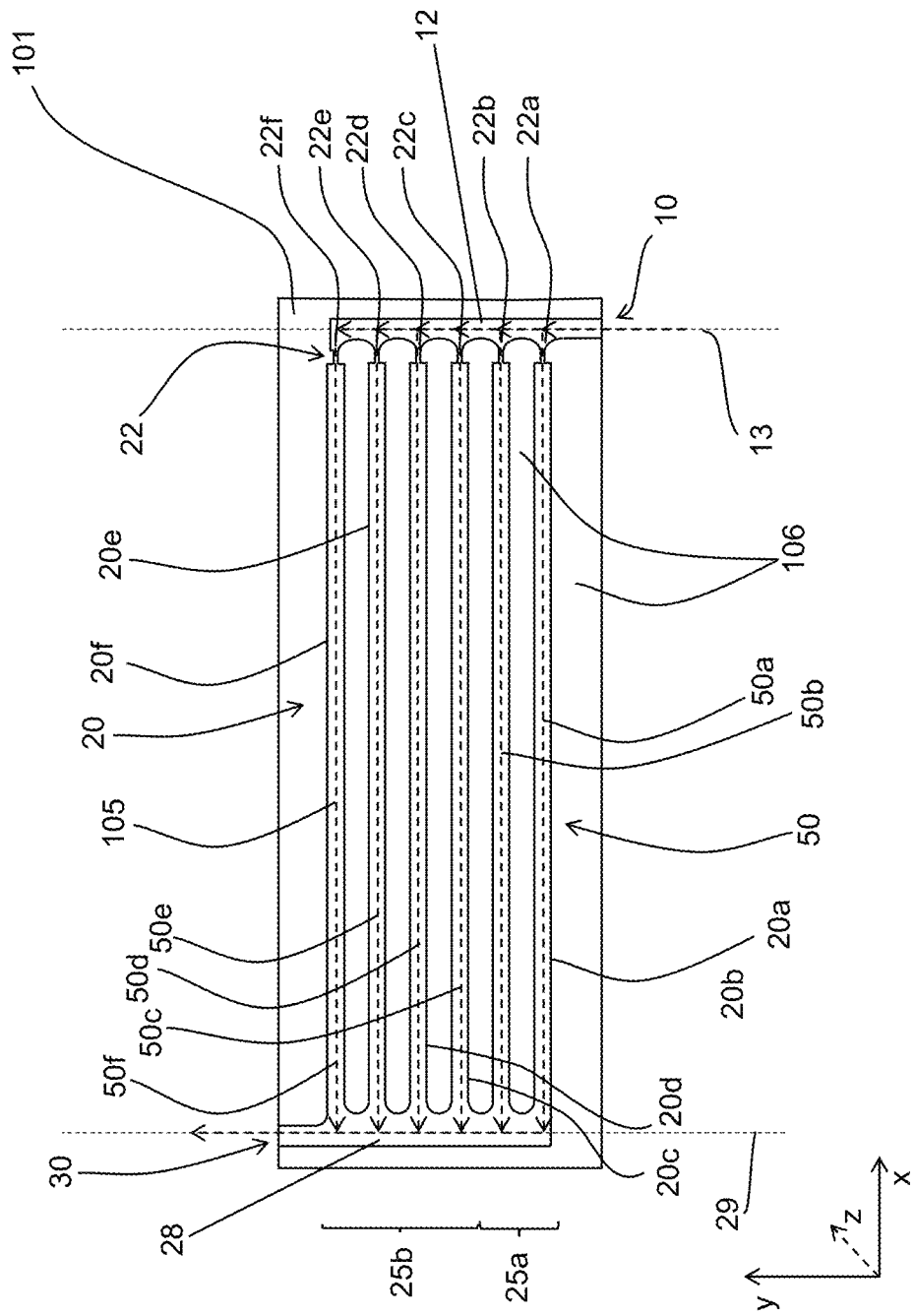
FIG. 4 is a schematic illustrations of the A-A cross section of a heat exchanger of the example embodiments of FIGS. 1-2.
Figure 5:
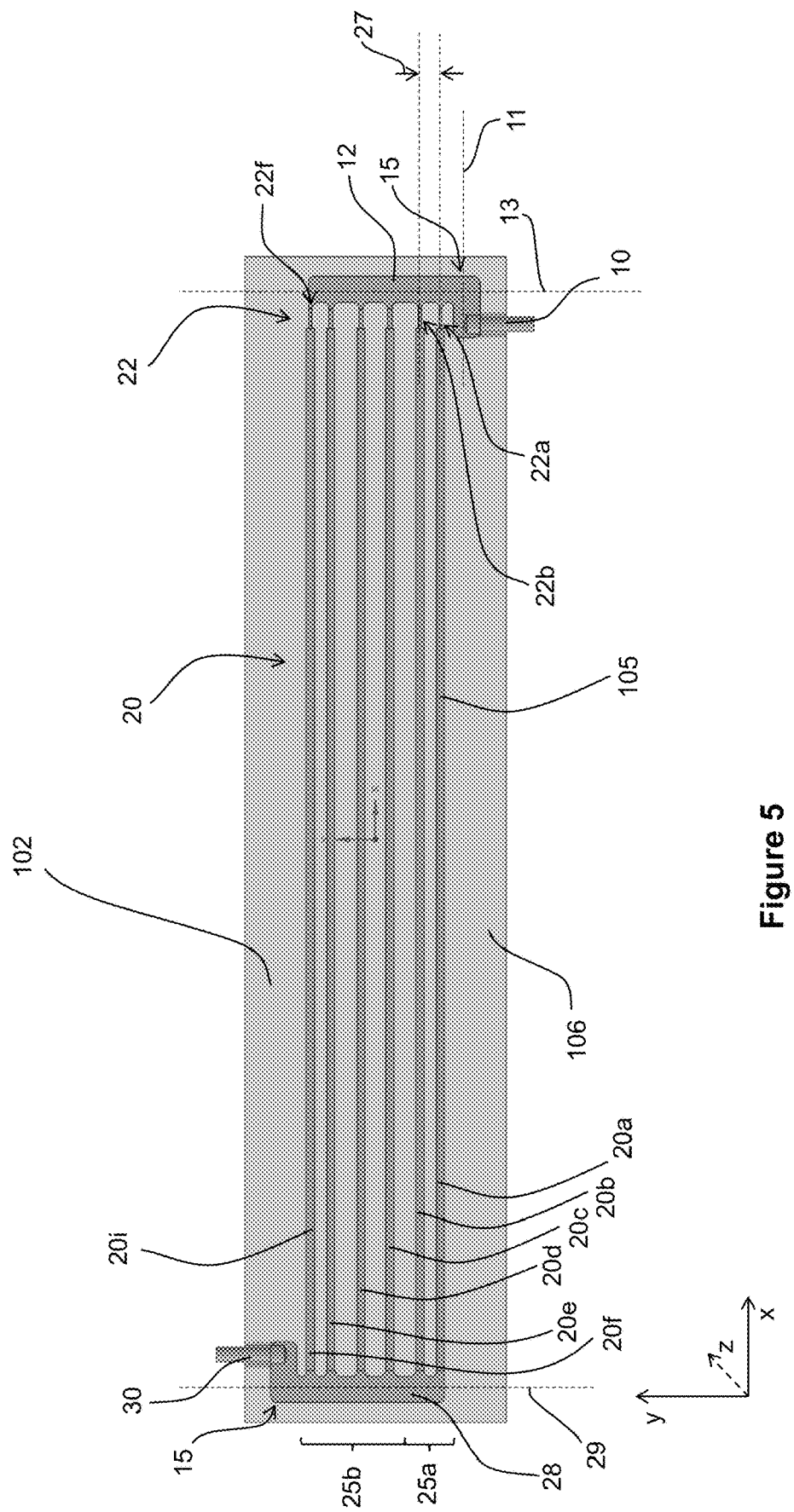
FIG. 5 schematic illustrations of the A-A cross sections of a heat exchanger of the example embodiments of FIGS. 1-2.
Figure 6:
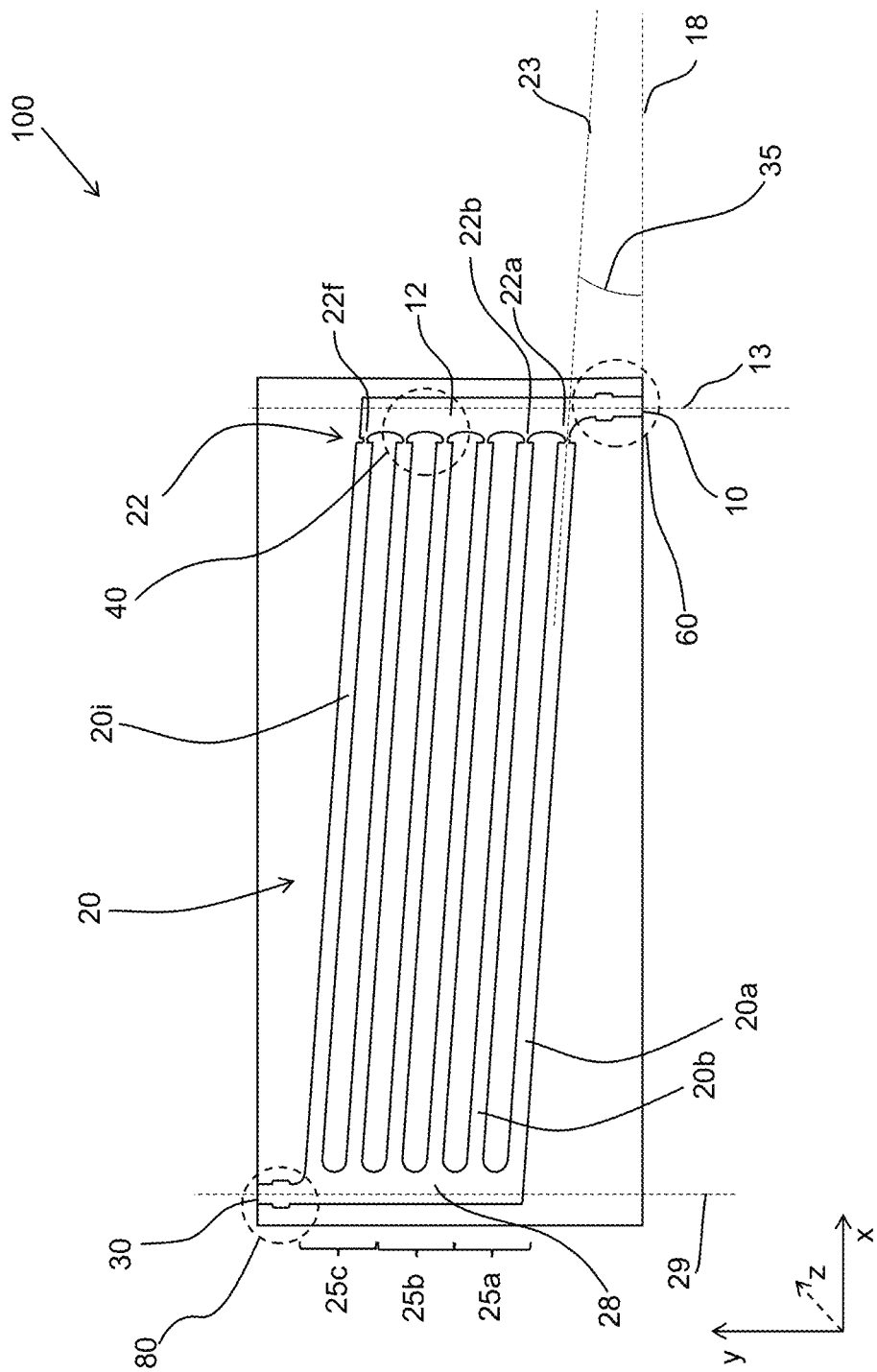
FIG. 6 schematic illustrations of the A-A cross sections of a heat exchanger of the example embodiments of FIGS. 1-2.

FIG. 4-6 are schematic illustrations of the A-A cross sections of FIG. 1-3. One, or both, metal plates (101, 102) can include a plurality of connected recesses 105 which can form a fluid circuit between the metal plates (101, 102) when the plates are joined. For example, a first metal plate 101 having a plurality of connected recesses 105 can be joined to a second flat metal plate 102 that does not have any recesses to form the heat exchanger 100. In another example, a first metal plate 101 and a second metal plate 102 can each have a plurality of connected recesses 105 which mirror one another such that when joined the connected recesses form the fluid circuit. Mating surfaces 106 can substantially border the plurality of connected recesses 105. Optionally, the mating surfaces 106 can include raised or recessed portions, or other engagement features to aid in alignment of the plates prior to joining.

The plurality of connected recesses 105 can have any shape in the depth dimension (e.g., as projected onto a z-y plane of the attached figures, into the plate), including semi-circular, semi-oval, triangular, square, rectangular, or any simple polygonal shape or portion thereof. For example, the recesses in a first metal plate 101 can be substantially rectangular such that substantially rectangular fluid passages are formed when it is joined to a mating second flat metal plate 102 (e.g., having no recesses). In another example, the recesses in a first metal plate 101 can be substantially square such that substantially square fluid passages are formed when it is joined to a mating second flat metal plate 102 (e.g., having no recesses). In another example, both a first metal plate 101 and a second metal plate 102 can include corresponding square shaped recesses 105 (e.g., mirroring one another) such that rectangular fluid passages are formed when the plates are joined. In another example, both a first metal plate 101 and a second metal plate 102 can include corresponding rectangularly shaped recesses 105 (e.g., mirroring one another) such that square fluid passages are formed when the plates are joined. In another example, both a first metal plate 101 and a second metal plate 102 can include corresponding semi-circle shaped recesses 105 (e.g., mirroring the recesses in the first plate) such that circular fluid passages are formed when the plates are joined.

The fluid circuit formed between the plates can be fluidly connected to the fluid inlet 10 and the fluid outlet 30 and include an inlet manifold 12, an outlet manifold 28, and a plurality of fluid passages 20 extending between and fluidly connecting the inlet manifold 12 and outlet manifold 28. The inlet manifold 12 and outlet manifold 28 can be arranged in any shape sufficient to deliver fluid from the fluid inlet 10 to the fluid passages 20. For example, the inlet manifold 12, the outlet manifold 28, or both can include a major axis 13 which extends perpendicular to the fluid passages 20. In further example, the inlet manifold 12, the outlet manifold 28, or both can include one or more turns 15 (e.g., such as forming a J or L shape in the x-y plane of the attached figures) where the manifold extends along a minor axis 11 and a major axis 13.

To facilitate draining fluid from the heat exchanger 100 (e.g., after the system is shutdown, in a service mode, or the like), the fluid passages 20 can be configured having a tilt angle 35. The tilt angle 35 can be defined as the angle between a plane 18 extending perpendicular to the direction of gravity (e.g., perpendicular to the major axis 13 of the inlet manifold 12) and a major axis 23 of a fluid passage of the plurality of fluid passages 20. The heat exchanger 100 can be configured having a tilt angle 35 of up to about 10°, for example about 9°, or about 8° or about 7° or about 6° or about 5°, or about 4° or about 3°, or about 2°, or about 1°.

Figure 7:
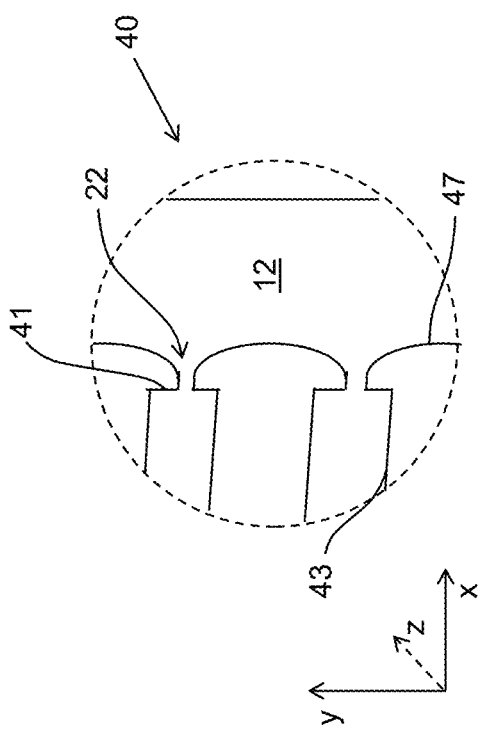
FIG. 7 schematic illustrations of an embodiment of section 40 FIG. 6.
Figure 8:
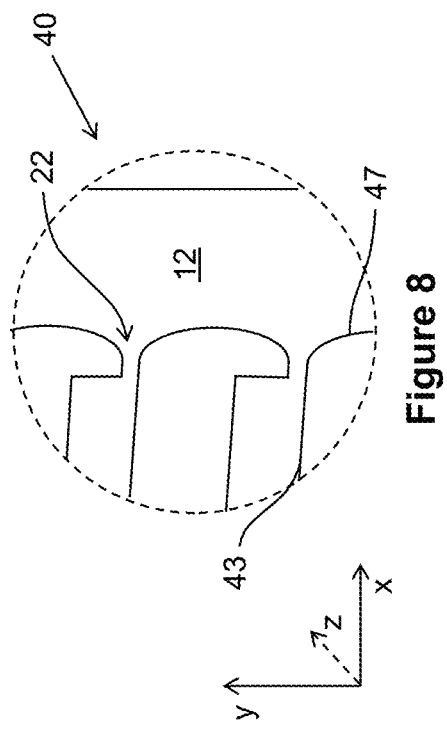
FIG. 8 schematic illustrations of an embodiment of section 40 FIG. 6.

FIGS. 7-8 are schematic illustrations of embodiments of the detail of section 40 of FIG. 6. The flow constrictions 22 can be located in an end wall 41 of fluid passages 20 in any way. For example, the flow constrictions 22 can be vertically centered in the end wall 41 of fluid passages 20 as shown in FIG. 7. To aid in draining fluid from the heat exchanger 100 (e.g., when the system is shutdown, in a service mode, or the like), flow constrictions 22 can be off centered in the end wall 41 of fluid passages 20. For example, as in FIG. 8, a flow constriction 22 can be positioned such that a lower wall 43 of the flow passage 20 transitions into an inner wall 47 of the inlet manifold 12 along a surface that slopes continuously downward (e.g., toward the fluid inlet 10).

Figure 9:
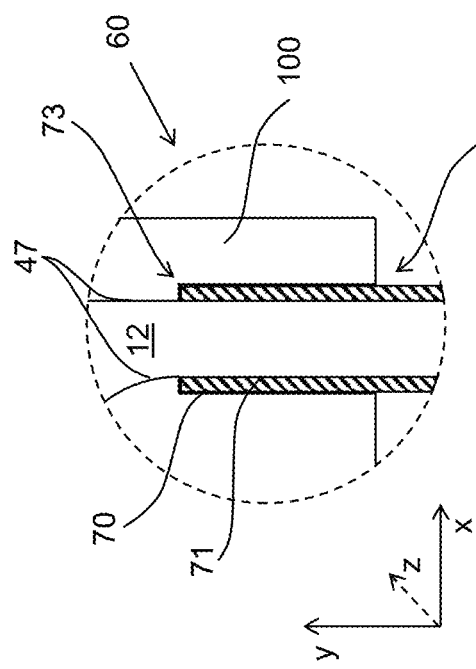
FIG. 9 schematic illustrations of an embodiment of section 60 FIG. 6.

FIG. 9 is a schematic illustration of the detail of section 60 of FIG. 6 showing a fluid conduit 70 fluidly connected to the fluid inlet 10 of heat exchanger 100. The heat exchanger 100 can be configured for a flush transition from the inner walls 71 of the fluid conduit 70 to the inner walls 47 of the inlet manifold 12. For example, a recess 73 disposed in the fluid inlet 10 can be sized to accommodate the thickness of the fluid conduit 70.

Figure 10:
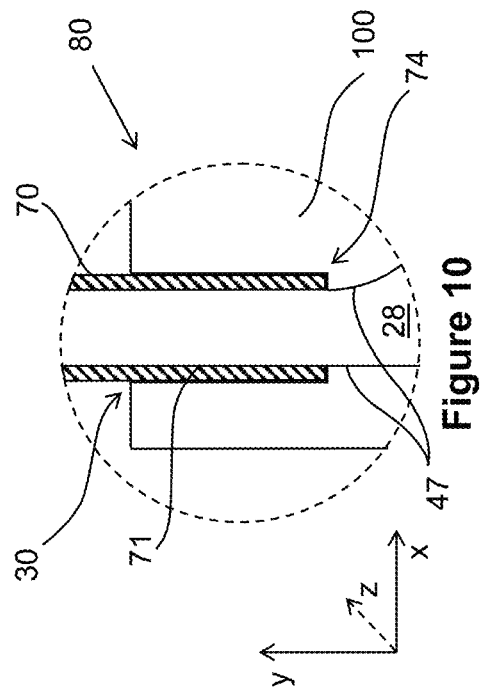
FIG. 10 schematic illustrations of an embodiment of section 80 FIG. 6.

FIG. 10 is a schematic illustration of the detail of section 80 of FIG. 6 showing a fluid conduit 70 fluidly connected to the fluid outlet 30 of heat exchanger 100. The heat exchanger 100 can be configured for a flush transition from the inner walls 47 of the outlet manifold 12 to the inner walls 71 of the fluid conduit 70. For example, a recess 74 disposed in the fluid outlet 30 can be sized to accommodate the thickness of the fluid conduit 70.

The fluid circuit can include a plurality of flow constrictions 22 which can be used to set, at least in part, the flow resistance characteristics for each of the parallel flowpaths 50 (e.g., unique flow routes extending between the fluid inlet 10 and the fluid outlet 30) through the heat exchanger 100. The flow constrictions 22 can be formed as part of the plurality of connected recesses 105, integral to one or both metal plates (101, 102). For example, a fluid passage 20 can include, or abut, a section of reduced hydraulic diameter defining the flow constriction 22. In another example, the flow constrictions 22 can be formed separately and be inserted between the metal plates (101, 102) before they are joined. For example, the fluid passage 20 can include one or more slots, notches, recesses, or other cooperating features (e.g. disposed along portions of the perimeter of the fluid passage 20, abutting an end of the fluid passage 20, or the like) to allow a flow constriction 22 (e.g., an orifice plate, orifice body, or the like) to be inserted into said slot, notch, recess or other cooperating feature before the metal plates (101, 102) are joined. The flow constrictions 22 can be disposed in the fluid circuit at the inlet to the fluid passages 20. The flow constrictions 22 can be disposed between the inlet manifold 12 and the plurality of fluid passages 20. The flow constrictions 22 can extend for a constriction length (e.g., measured in the direction that fluid flows through the constriction, substantially along the x-dimension in the attached figures or along the major axis 23 of the parallel fluid passage 20), a constriction width (e.g., measured in a direction perpendicular to that direction that fluid flows through the constriction, substantially along the y-dimension in the attached figures), and a constriction depth (e.g., measured in a direction perpendicular to that direction that fluid flows through the constriction, substantially along the z-dimension in the attached figures). The flow constriction length divided by the hydraulic diameter of the fluid passage 20 can be from about 2 to about 4, or from about 2.5 to about 3.5, or from about 2.7 to about 3.1, or from about 2.75 to about 2.9, or from about 2.77 to about 2.85, or about 2.8. The constriction depth of one or more of the plurality of flow constrictions 22 can be different than the depth of the corresponding flow passage 20. For example, the constriction depth of a flow constriction 22 can be from about 2% to about 75% of the depth of the corresponding flow passage 20, or from about 2% to about 50%, or from about 2% to about 25%, or from about 2% to about 20%, or from about 2% to about 15%, or from about 2% to about 12%, or from about 2% to about 10%, or from about 4% to about 15%, or from about 5% to about 15%, or from about 6% to about 15%, or from about 6% to about 12% or from about 6% to about 10%.

Individual flow constrictions of the plurality of flow constrictions 22 can have a ratio of flow constriction hydraulic diameter to corresponding fluid passage hydraulic diameter which increases with increasing distance from the fluid inlet 10. For example, a first flow constriction 22a of a plurality of flow constrictions 22 can be disposed closest to the fluid inlet 10 and can have the smallest ratio of flow constriction hydraulic diameter to corresponding fluid passage hydraulic diameter of the plurality of flow constrictions 22. Further, a last flow constriction 22f can be disposed furthest away from the inlet 10 and can have the largest ratio of flow constriction hydraulic diameter to corresponding fluid passage hydraulic diameter of the plurality of flow constrictions 22.

The ratio of flow constriction hydraulic diameter to corresponding fluid passage hydraulic diameter can be stepped throughout the heat exchanger 100. The said ratio can change from a first group 25a of flowpaths 50 to a second group 25b of flowpaths 50. Said ratio can increase equally for all flowpaths 50 in each group 25 of the heat exchanger 100 with increasing distance from the fluid inlet 10. For example, a heat exchanger 100 configured with two flow resistance steps therethrough can include a first group 25a of two or more adjacent flowpaths 50 having substantially the same flow resistance characteristics (e.g., flowrate to pressure-drop relationship) and a second group 25b of two or more adjacent flowpaths 50 having substantially the same flow resistance characteristics that are different from those of the first group 25a (i.e., less restrictive to flow therethrough comparted to the first group 25a). The first group 25a can include two adjacent flowpaths 50 having substantially equal fluid flow resistance characteristics. For example, the first group 25a can include a first flowpath 50a through the first flow constriction 22a and a corresponding fluid passage 20a and a second flowpath 50b through a second flow constriction 22b and a corresponding fluid passage 20b having substantially equal fluid flow resistance characteristics. The ratio of flow constriction hydraulic diameter to corresponding fluid passage hydraulic diameter for the first group 25a (adjacent the fluid inlet 10) can be from about 0.3 to about 0.5, or from about 0.35 to about 0.49, or from about 0.40 to about 0.48, or from about 0.43 to about 0.47, or from about 0.44 to about 0.46, or about 0.45. For example, the ratio of flow constriction hydraulic diameter to corresponding fluid passage hydraulic diameter for the first group 25a can be about 0.30, or about 0.31, or about 0.32, or about 0.33, or about 0.34, or about 0.35, or about 0.36, or about 0.37, or about 0.38, or about 0.39, or about 0.40, or about 0.41, or about 0.42, or about 0.43, or about 0.44, or about 0.45, or about 0.46, or about 0.47, or about 048, or about 0.49, or about 0.50.

The ratio of flow constriction hydraulic diameter to corresponding fluid passage hydraulic diameter for groups 25 of flowpaths 50 can increase by a scaling factor with increasing distance from the fluid inlet 10. This scaling factor can be a multiplier which can be used to scale the ratio of flow constriction hydraulic diameter to corresponding fluid passage hydraulic diameter for subsequent groups 25 of flowpaths 50 as the groups 25 are located further away from the fluid inlet 10. The scaling factor can be from about 1.2, to about 1.5, or about 1.25 to about 1.45, or about 1.27 to about 1.4, or from about 1.28 to about 1.35, or from about 1.29 to about 1.32. For example, the scaling factor can be about 1.20, or about 1.21, or about 1.22, or about 1.23, or about 1.24, or about 1.25, or about 1.26, or about 1.27, or about 1.28, or about 1.29, or about 1.30, or about 1.31, or about 1.32, or about 1.33, or about 1.34, or about 1.35, or about 1.36, or about 1.37, or about 1.38, or about 1.39, or about 1.40, or about 1.41, or about 1.42, or about 1.43, or about 1.44, or about 1.45, or about 1.46, or about 1.47, or about 1.48, or about 1.49, or about 1.50.

The scaling factor can be used to increase the ratio of flow constriction hydraulic diameter to corresponding fluid passage hydraulic diameter which can include increasing the flow area of the flow constriction 22 or reducing the flow area of the corresponding flow passage 20. For example, the scaling factor can be used to increase the flow area (e.g., hydraulic diameter) of the flow constrictions 22 in each group 25 of flowpaths 50 as the groups are located further from the fluid inlet 10. Increasing the size of the flow constrictions 22 can include enlarging the cross-sectional perimeter (e.g., in a plane perpendicular to the average flow vector of the fluid flowing therethrough) or changing its shape to increase the cross-sectional flow area of the constriction. Further, a first group 25a of flowpaths 50 can have a first flow resistance characteristic (e.g., pressure drop at a given flow rate) and a second group 25b of flowpaths 50 can have a second flow resistance characteristic where the second flow resistance characteristic equals between 1.2 and 1.5 times the first flow resistance characteristic. For example, the flowpaths 50 in the first group 25a can have a ratio of flow constriction hydraulic diameter to corresponding fluid passage hydraulic diameter equal to about 0.45 while said ratio is scaled up by a scaling factor of about 1.39 to about 0.625 for flowpaths 50 in the second group 25b. Still further, said ratio can be scaled up to about 0.75 in a third group 25c of flowpaths 50 by applying a scaling factor of 1.2 to said ratio in the second group 25b (the adjacent group closer to the fluid inlet 10).

The heat exchanger 100 can include from four to twenty fluid passages 20 and corresponding flow constrictions 22 (e.g., fluidically in-line with the fluid passage 20). For example, the heat exchanger 100 can include six fluid passages 20 and corresponding flow constrictions 22. As in FIG. 5, a heat exchanger 100 having six fluid passages 20 can be configured with two groups (25a, 25b) of flowpaths 50. A first group 25a can include the two flowpaths (50a, 50b) disposed closest to the fluid inlet 10 and a second group 25b can include the four flowpaths (50c, 50d, 50e, 500 disposed furthest from the fluid inlet 10. The flow characteristics of the two flowpaths (50a, 50b) of the first group 25a can be substantially equal, e.g., due to having substantially equal ratios of flow constriction hydraulic diameter to fluid passage hydraulic diameter, the fluid passages (20a, 20b) and flow constrictions (22a, 22b) of the group 25a having substantially similar geometric construction (e.g., shape, dimensions, and the like), a combination thereof, or the like. The flow characteristics of the four flowpaths (50c, 50d, 50e, 500 of the second group 25b can be substantially equal, e.g., due to having substantially equal ratios of flow constriction hydraulic diameter to fluid passage hydraulic diameter, the fluid passages (20c, 20d, 20e, 200 and flow constrictions (22c, 22d, 22e, 220 of the group 25b having substantially similar geometric construction (e.g., shape, dimensions, and the like), a combination thereof, or the like The fluid passages 20 can be arranged substantially parallel to one another. The fluid passages 20 can have a substantially equal spacing distance 27 therebetween (e.g., in the x-y plane of the attached figures). Optionally, the spacing distance 27 can be varied throughout the heat exchanger 100. For example, the spacing distance 27 divided by the average hydraulic diameter of the two adjacent fluid passages, can be from about 1.25 to about 5, or from about 1.5 to about 4.5, or from about 1.75 to about 4.25, or from about 2.0 to about 4.0, or from about 2.1 to about 3.5, or from about 2.15 to about 3.35, or from about 2.2 to about 3.2.

The length of the fluid passages 20, divided by the hydraulic diameter of the fluid passage 20 can be from about 25 to about 250, or from about 30 to about 200, or from about 40 to about 180, or from about 50 to about 150, or from about 60 to about 140, or from about 75 to about 130, or from about 90 to about 120, or from about 100 to about 120, or from about 105 to about 115, or about 110, or about 111, or about 112.

The heat exchanger 100 can be configured for operation in a substantially vertical orientation. For example, a first major axis 13 of the inlet manifold 12 and a second major axis 29 of the outlet manifold 28 can extend substantially vertically (e.g., substantially aligned with the direction of Earth's gravitational force) and the plurality of fluid passages can be arranged one atop of the other, where the fluid inlet 10 is disposed below the fluid outlet 30. In this configuration a flow direction of a heat transfer fluid substantially opposes gravity as the heat transfer fluid traverses the heat exchanger 100 from the fluid inlet 10 to the fluid outlet 30. In the vertical orientation, including flow constrictions 22 as described herein can overcome the gravitational effect which tends to bias vapor phase refrigerant toward the top of the heat exchanger 100.

The heat exchanger 100 can be configured for mounting one or more power electronic modules 200 directly to the surface of one of both metal plates (101, 102). For example, one or both metal plates (101, 102) of the heat exchanger 100 can include fastening features (e.g., threads for receiving bolts or screws, clips, exposed bolt or screw shafts, tabs, slots, notches, or other engagement features) disposed along its outer surface for securing the one or more power electronics modules 200 to the heat exchanger 100 in a way that facilitates the transfer of thermal energy away from the power electronics module 200. The term "power electronic module" as used herein can refer to an electronic component which can provide a controlled output power by modulating and/or converting a supplied input power (e.g., a variable frequency drive, power rectifier, power converter, and the like). Such a power electronic module 200 can be used to control the speed of a compressor and/or the speed of the fan of a vapor compression system (e.g., chiller) based on various predetermined system conditions.

The one or more power electronics modules 200 can be attached to a circuit card or board on which various other electrical components are mounted (e.g., compressor and/or fan speed control related components). The reliability and life of the one or more power electronic modules 200 can dependent upon precluding such components from operating at high temperatures and/or precluding their exposure to thermal shock. Because these components can generate a large amount of heat, they can have a heat sink interface (e.g., exposed copper surface) which is designed for attachment to a heat sink through use of previously described fastening features. When secured in thermal communication with the heat exchanger 100 the heat generated by the one or more power electronics module 200 can be removed through the heat sink interface to keep the one or more power electronics module 200 cooled below its maximum allowable operating temperature (e.g., 150° F.). Optionally, insulation can be disposed along exposed surfaces of the heat exchanger 100 (e.g., surfaces not in thermal communication with one or more power electronics modules 200) to hinder heat absorption from ambient conditions or heat sources other than the one or more power electronics modules 200. Optionally, heat transfer fins can be attached in thermal communication with one or more outer surfaces of the heat exchanger 100.

The heat transfer fluid (e.g., refrigerant) provided to the heat exchanger 100 can originate from the condenser of a vapor compression cycle and can enter the heat exchanger in a liquid phase with 0% vapor quality. The presently disclosed heat exchanger 100 can be operated to ensure the vapor quality of refrigerant exiting the fluid outlet 30 has a vapor quality of from about 35% to about 65%, or from about 40% to about 60%, or from about 45% to about 55%, or about 50%.

In an example embodiment the heat exchanger 100 can have a length (e.g., measured along the x-axis dimension in the attached figures) of about 900 mm, a width (e.g., measured along the z-axis dimension in the attached figures) of about 27 mm and a height (e.g., measured along the y-axis dimension in the attached figures) of about 200 mm. The heat exchanger 100 can comprise six fluid passages 20 having a hydraulic diameter of about 7.2 millimeters (mm). The length of the flow passages 20 can be about 800 mm and the spacing distance between adjacent flow passages 20 can vary from about 15 mm to about 23 mm. The two flow passages 20 disposed closest to the fluid inlet 10 can be grouped together into a first group 25a where each flowpath 50 within the first group 25a includes a flow constriction 22 having a hydraulic diameter or about 3.25 mm. The remaining four flow passages 20 (those further away from the fluid inlet 10) can be grouped together into a second group 26b where each flowpath 50 within the second group 25b includes a flow constriction 22 having a hydraulic diameter that is equal to about 1.39 times the hydraulic diameter of the flow constrictions in the first group 25a, or about 4.5 mm. The flow constrictions in both groups 25a and 25b can have a length of about 20 mm. The inlet manifold 12 and outlet manifold 28 can each have a hydraulic diameter of about 12.25 mm.

Table 1 summarizes computation fluid dynamics (CFD) modeling results showing a comparison between a first heat exchanger (Heat Exchanger 1) having no flow constrictions 22 and a second heat exchanger (Heat Exchanger 2) having flow constrictions 22 disposed fluidly in-line with the flow passages 20 as described herein. In this example, the flow constrictions 22 reduced the standard deviation of flow rate through the parallel flow passages from about 11.7% of total flow in Heat Exchanger 1 to about 6.1% of total flow in Heat Exchanger 2, corresponding to a reduction of more than 90%. Further, the largest flow difference between flow passages was reduced from 29% of total flow in Heat Exchanger 1 (between Passage 1 and Passage 5) to 18% of total flow in Heat Exchanger 2 (between Passage 3 and Passage 6), corresponding to a reduction of about 38%.

TABLE 1

Heat Exchanger Comparison

| | % of Total Flow to Passage 1 | % of Total Flow to Passage 2 | % of Total Flow to Passage 3 | % of Total Flow to Passage 4 | % of Total Flow to Passage 5 | % of Total Flow to Passage 6 | Standard Deviation |
|---|---|---|---|---|---|---|---|
| Heat Exchanger 1 | 30 | 28 | 22.5 | 14 | 1 | 1.5 | 11.7 |
| Heat Exchanger 2 | 20.5 | 19.5 | 23.5 | 19 | 11.5 | 5.5 | 6.1 |

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A heat exchanger comprising a pair of metal plates joined along corresponding mating surfaces, wherein at least one of the metal plates comprises a plurality of connected recesses which form a fluid circuit between the plates when the plates are joined, wherein the fluid circuit comprises an inlet, an inlet manifold, an outlet, an outlet manifold, and a plurality of flowpaths extending between and fluidly connecting the inlet manifold and outlet manifold, wherein one or more of the plurality of flowpaths comprise a fluid passage and a flow constriction, and wherein a ratio of the hydraulic diameter of the flow constriction to the hydraulic diameter of the fluid passage increases with increasing distance from the inlet;
   wherein the heat exchanger is configured for operation in a substantially vertical orientation, wherein a major axis of the inlet manifold and a major axis of the outlet manifold extend substantially vertically, and the plurality of fluid passages are arranged one atop of the other, and wherein the inlet is disposed below the outlet such that during operation a flow direction of a refrigerant through the inlet and outlet manifolds opposes gravity.

2. The heat exchanger of claim 1, wherein the flow constriction is disposed between the fluid passage and the inlet manifold.

3. The heat exchanger of claim 1, wherein both plates comprise correspondingly arranged connected recess that when joined form the fluid circuit.

4. The heat exchanger of claim 3, wherein the second flow constriction hydraulic diameter is equal to from 1.2 to 1.5 times the first flow constriction hydraulic diameter.

5. The heat exchanger of claim 3, further comprising a third group of two or more adjacent flowpaths, not in the first group or second group, comprising a flow constriction having a third flow constriction hydraulic diameter, and wherein the third flow constriction hydraulic diameter is greater than each the first flow constriction hydraulic diameter and the second flow constriction hydraulic diameter.

6. The heat exchanger of claim 4, wherein the third flow constriction hydraulic diameter is equal to from 1.2 to 1.5 times the second flow constriction hydraulic diameter.

7. The heat exchanger of claim 4, wherein the second flow constriction hydraulic diameter is equal to from 1.2 to 1.5 times the first flow constriction hydraulic diameter and the third flow constriction hydraulic diameter is equal to between 1.2 and 1.5 times the second flow constriction hydraulic diameter.

8. The heat exchanger of claim 1, wherein during operation, the refrigerant entering the inlet is a single phase liquid refrigerant having a vapor quality equal to zero, and the refrigerant exiting the outlet is a two-phase mixture having a vapor quality between 0.4 and 0.6, inclusive of end points.

9. The heat exchanger of claim 1, further comprising a power electronics module mounting feature disposed on a face of one of the metal plates, and wherein the face is disposed on a side of the metal plate opposite the mating surface.

10. The heat exchanger of claim 1, wherein the connected recesses forming the inlet and outlet each comprise an engagement feature for securing a fluid conduit thereto.

11. The heat exchanger of claim 1, wherein the plates are joined by a weld and wherein the weld forms a seal between the plates along at least a portion of the mating surfaces.

12. The heat exchanger of claim 1, wherein the plates are joined by a compression mechanism configured to hold the plates together.

13. The heat exchanger of claim 1, further comprising a seal material disposed between the plates for preventing leakage from the fluid circuit.

14. The heat exchanger of claim 1, wherein the fluid passage extends at a tilt angle of less than or equal to 10°.

15. A refrigerant cycle machine comprising:
a primary refrigeration circuit configured for passing a refrigerant through a compressor, a heat rejecting heat exchanger, an expansion valve, and a heat absorbing heat exchanger in a serial flow arrangement,
an expansion valve bypass circuit for diverting at least a portion of the refrigerant exiting the heat rejecting heat exchanger of the primary refrigeration circuit to an electronics cooler and returning the portion of the refrigerant to the heat absorbing heat exchanger, and wherein the electronics cooler comprises the heat exchanger of claim 1 and wherein the portion of the refrigerant is directed through the heat exchanger to cool one or more power electronics modules attached in thermal communication thereto.

16. The refrigerant cycle machine of claim 15, wherein the expansion valve bypass circuit comprises two electronics coolers disposed in parallel flow arrangement, one for cooling a power rectifier and the other for cooling an inverter.

17. A heat exchanger comprising a pair of metal plates joined along corresponding mating surfaces, wherein at least one of the metal plates comprises a plurality of connected recesses which form a fluid circuit between the plates when the plates are joined, wherein the fluid circuit comprises an inlet, an inlet manifold, an outlet, an outlet manifold, and a plurality of flowpaths extending between and fluidly connecting the inlet manifold and outlet manifold, wherein one or more of the plurality of flowpaths comprise a fluid passage and a flow constriction, and wherein a ratio of the hydraulic diameter of the flow constriction to the hydraulic diameter of the fluid passage increases with increasing distance from the inlet;
wherein a first flow constriction is disposed in the fluid passage closest to the inlet and comprises a ratio of hydraulic diameter of the flow constriction to the hydraulic diameter of the fluid passage of between 0.3 and 0.5 inclusive or end points.

18. A heat exchanger comprising a pair of metal plates joined along corresponding mating surfaces, wherein at least one of the metal plates comprises a plurality of connected recesses which form a fluid circuit between the plates when the plates are joined, wherein the fluid circuit comprises an inlet, an inlet manifold, an outlet, an outlet manifold, and a plurality of flowpaths extending between and fluidly connecting the inlet manifold and outlet manifold, wherein one or more of the plurality of flowpaths comprise a fluid passage and a flow constriction, and wherein a ratio of the hydraulic diameter of the flow constriction to the hydraulic diameter of the fluid passage increases with increasing distance from the inlet;
wherein a first group of two or more adjacent flowpaths closest to the inlet comprise a flow constriction having a first flow constriction hydraulic diameter and a second group of two or more adjacent flowpaths, not in the first group, comprise a flow constriction having a second flow constriction hydraulic diameter, and wherein the second flow constriction hydraulic diameter is greater than the first flow constriction hydraulic diameter.

19. A heat exchanger comprising a pair of metal plates joined along corresponding mating surfaces, wherein at least one of the metal plates comprises a plurality of connected recesses which form a fluid circuit between the plates when the plates are joined, wherein the fluid circuit comprises an inlet, an inlet manifold, an outlet, an outlet manifold, and a plurality of flowpaths extending between and fluidly connecting the inlet manifold and outlet manifold, wherein one or more of the plurality of flowpaths comprise a fluid passage and a flow constriction, and wherein a ratio of the hydraulic diameter of the flow constriction to the hydraulic diameter of the fluid passage increases with increasing distance from the inlet;
comprising greater than two groups of adjacent flowpaths through the heat exchanger, each flowpath comprising a fluid passage and a flow constriction, wherein the flow constrictions in flowpaths of groups further distanced from the inlet comprises a flow constriction hydraulic diameter equal to from 1.2 to 1.5 times the flow constriction hydraulic diameter of the flow constrictions in the flowpaths of groups immediately adjacent and closer to the inlet.

* * * * *